(12) United States Patent
Ebels et al.

(10) Patent No.: US 8,329,049 B2
(45) Date of Patent: Dec. 11, 2012

(54) METHOD OF FABRICATING A NANOSTRUCTURE ON A PRE-ETCHED SUBSTRATE

(75) Inventors: Ursula Ebels, Grenoble (FR); Bernard Dieny, Lans en Vercors (FR); Dominique Lestelle, Paris (FR); Eric Gautier, St Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 881 days.

(21) Appl. No.: 12/375,272

(22) PCT Filed: Jun. 26, 2007

(86) PCT No.: PCT/IB2007/002912
§ 371 (c)(1),
(2), (4) Date: Apr. 16, 2009

(87) PCT Pub. No.: WO2008/012684
PCT Pub. Date: Jan. 31, 2008

(65) Prior Publication Data
US 2010/0003421 A1 Jan. 7, 2010

(30) Foreign Application Priority Data
Jul. 27, 2006 (FR) ...................... 06 06907

(51) Int. Cl.
*B23P 15/00* (2006.01)
*C03C 25/00* (2006.01)
*C23F 1/00* (2006.01)
*B05D 3/00* (2006.01)

(52) U.S. Cl. .......... 216/39; 427/299; 427/532; 977/762; 977/890; 977/891

(58) Field of Classification Search .................. 977/763, 977/890, 891
See application file for complete search history.

(56) References Cited

U.S. PATENT DOCUMENTS
6,667,492 B1 12/2003 Kendall
(Continued)

FOREIGN PATENT DOCUMENTS
EP 1840648 A1 * 10/2007

OTHER PUBLICATIONS

Landis et al., "Magnetic properties of Co/Pt multilayers deposited on silicon dot arrays", Nov. 2000, Physical Review B, vol. 62 No. 18 pp. 12271-12281.*

(Continued)

*Primary Examiner* — Shamim Ahmed
*Assistant Examiner* — Bradford Gates
(74) *Attorney, Agent, or Firm* — Oblon, Spivak, McClelland, Maier & Neustadt, L.L.P.

(57) ABSTRACT

The present invention relates to a method of fabricating a nanostructure, comprising the following steps: prestructuring a substrate (1) adapted to receive the nanostructure to form a nanorelief (2) on the substrate, the nanorelief having flanks (4) extending from a bottom (1a) of the substrate and a top face (3) extending from said flanks, and then depositing on the substrate pre-structured in this way a single layer or multilayer coating intended to form the nanostructure; and further comprising: adding to the prestructured substrate or to the coating a separation layer adapted to enable separation of the coating and the substrate by external action of mechanical, thermomechanical or vibratory type; and exerting this external action on the substrate and/or the coating to recover selectively a top portion of the coating by separating it from the top face of the nanorelief so that this top portion constitutes some or all of the nanostructure.

24 Claims, 5 Drawing Sheets

U.S. PATENT DOCUMENTS

| | | |
|---|---|---|
| 2002/0130311 A1 | 9/2002 | Lieber et al. |
| 2004/0082178 A1* | 4/2004 | Kamins et al. ............... 438/691 |
| 2005/0161659 A1* | 7/2005 | Bakkers ............................ 257/9 |
| 2005/0164432 A1 | 7/2005 | Lieber et al. |
| 2006/0014001 A1* | 1/2006 | Zhang et al. ............... 428/195.1 |
| 2006/0124345 A1* | 6/2006 | Asami et al. ................. 174/250 |
| 2007/0026645 A1 | 2/2007 | Lieber et al. |
| 2007/0032051 A1 | 2/2007 | Lieber et al. |
| 2007/0032052 A1 | 2/2007 | Lieber et al. |
| 2007/0048492 A1 | 3/2007 | Lieber et al. |
| 2008/0283269 A1* | 11/2008 | Graham et al. ................. 174/98 |
| 2010/0021985 A1* | 1/2010 | Mason .......................... 435/174 |

OTHER PUBLICATIONS

Leven et al., "Domain wall resistance in (Co/Pt)10-nanowires", May 2005, Europhysics Letters 70, 6, pp. 803-809.*

Liu, Y. et al., "Fabrication of SiCn Mems Structures Using Microforged Molds", IEEE International Micro Electro Mechanical Systems Conference, vol. Conf. 14, pp. 118-121 (2001) XP010534566.

\* cited by examiner

METHOD OF FABRICATING A NANOSTRUCTURE ON A PRE-ETCHED SUBSTRATE

The present invention relates to a method of fabricating totally or partly self-supporting nano-structures using a pre-structured substrate, the method comprising depositing a coating intended to form the nanostructures on the substrate and at least partial separation of that coating.

Nanostructures or nano-objects are defined in the art as having one or more dimensions in the range 1 nanometer (nm) to 200 nm. The increasing interest aroused by these objects is explained by the remarkable properties thereof that emerge when their sizes are in the nanometer range and more particularly when characteristic dimensions, such as the mean free path of elastic diffusion of electrons or the Fermi wavelength, are of the same order of magnitude as, or even greater than, the nanometric dimensions of the structure.

Many applications stem from these phenomena, both in physics and in chemistry. Moreover, it is now feasible to integrate these nanostructures into nanoelectro-mechanical systems (NEMS). The fabrication of 0D, 1D, 2D or 3D nano-objects is therefore becoming more and more widespread.

In the history of the synthesis of nano-objects, mention can be made in particular of the discovery of carbon nanotubes in 1991 by Ijima, who used a transmission electron microscope to observe soot produced from synthesis of fullerenes by means of an electric arc. That method consists in establishing a discharge between two graphite electrodes in an inert atmosphere. The high temperatures (4000 K) of the plasma generated between the electrodes during the process lead to sublimation of the graphite. The typical synthesis time is two to ten minutes, after which products of four types may be recovered, according to their location within the reactor.

The mass synthesis of carbon nanotubes by the electric arc process began in 1992, and in 1993 synthesis in a 500 Torr inert atmosphere electric arc reactor produced single-layer carbon nanotubes. Since then, synthesis methods have been continuously improved and diversified (methods using catalytic decomposition, laser ablation), producing nanotubes that are more homogeneous in terms of their size and the number of layers.

These nanotubes are generally obtained in the form of bundles. It is therefore very difficult to obtain individual nanotubes, for which purpose they must be subjected to chemical treatment.

Fluorination of the tubes (Phys. Chem. Chem. Phys., 2002, 4, 2278-2285) is one method of obtaining isolated nanotubes on the surface of a substrate. These nanotubes are used both for new devices in microelectronics (electrical transport, transistors, field emissions) and, for their mechanical properties, in the form of fibers.

Synthesizing these carbon nanotubes is a research topic that is still current. At present the growth mechanisms are not fully understood.

The methods developed include catalytic decomposition, which consists in passing through an oven at atmospheric pressure on a solid (for example ceramic) support a stream of carbon-containing precursors containing particles of catalyst (S. Fan, Science, 1999, 283, 512-514), growth occurring on the catalyst nano-particles. That method has two substantial advantages:

nanotubes perpendicular to the support containing the catalyst can be grown, so that oriented samples are obtained; and nanotubes can be grown in predefined patterns using lithographic and etching techniques, with the catalyst being distributed in a particular pattern.

Growing carbon nanotubes has stimulated the development of nano-object synthesis with other chemical elements. Two types of synthesis process are generally distinguished:

the first approach, known as "Bottom-Up", is a chemical approach more relevant to chemical processes: electrochemical deposition in mesoporous membranes, direct chemical synthesis with or without catalysts, sol-gel method;

the second or "Top-Down" approach groups together physical methods of electron lithography, U.V., AFM (atomic force microscopy) lithography, chemical or ion etching and depositing thin epitaxial layers by MBE (molecular beam epitaxy), or CVD (chemical vapor deposition); a final step of selective chemical attack or etching may be effected to form and/or separate the nano-structure.

The chemical or "Bottom-Up" methods are the most widely used for fabricating nanostructures, and nano-filaments in particular, since they can produce a greater diversity of materials, and they have a high potential for the mass production of nano-objects at lower cost.

The objects obtained using those chemical approaches are generally monocrystalline or polycrystalline. The production of a solid from a vapor phase or a liquid implies two fundamental steps: nucleation and growth.

Growth in porous membranes is another synthesis approach widely used for producing nanofilaments (J. C. Hulteen, C. R. Martin, J. Mater, Chem. 1997, 7, 1075 b). Membranes of two sorts are used, either of polymer or of alumina. Holes perpendicular to the surface of the membrane are obtained beforehand by chemical or electro-chemical attack or by particle (e.g. heavy ion) bombardment. The material constituting the nanostructure must be introduced into the pores of the membrane using vapor phase deposition, liquid phase injection, or electrodeposition methods. It is equally possible to use a metal with a very low melting point, such as bismuth, which can be injected directly into the pores and which serves as a catalyst. The nanofilaments obtained in this way are crystalline or polycrystalline. The final step is selective chemical attack to remove the membrane. The nanofilaments are thus recovered together.

Those techniques produce crystalline or polycrystalline objects in large quantities.

An important research area relates to the self-organization of nanofilaments or nanotubes on the surface of a substrate. Nanofilaments of $ErSi_2$ on an Si (001) surface have been obtained. The filaments are grown on the surface of the substrate in the directions that have the smallest lattice parameter mismatch between the substrate and the filament. Using those approaches, there is weak growth of filaments parallel to the interface.

A large proportion of chemical synthesis is based on vapor phase methods (CVD in particular). A vapor of the elements that will constitute the nanostructure is obtained by evaporation, chemical reduction, or any other type of gaseous reaction. The gaseous species are transported to and condensed on the surface of a substrate at a temperature that is lower than that of the source. By precise control of supersaturation, 1D nano-structures may be obtained. That technique is widely employed to synthesize nanofilaments of semiconductors such as GaAs, SiGe, and also $Si_3N_4$, SiC, ZnO.

Those chemical methods cannot produce an individual object. Nanofilaments are generally synthesized in packets and tend to agglomerate in bundles, which necessitates chemical treatments such as fluorination to obtain individual nanofilaments.

Physical or "Top-Down" methods combine the techniques of electron lithography, AFM lithography, chemical and ion etching, and MBE deposition.

Those techniques can be divided into two classes: additive and subtractive. For the smallest sizes (below 100 nm), U.V. lithography is replaced by electron lithography, which can produce finer patterns.

The team of O. G. Schmidt at the Max Planck Institute has developed another technique for fabricating nano-structures of various shapes that has been used to form nanometric objects of various shapes (tubes, rods, rings) on substrates (Physica E 13 (2002) 969-973). That technique utilizes stressed epitaxial systems, which are structured in the form of nano-objects by lithography and etching, after which chemical attack separates a sacrificial layer deposited between the substrate and the stressed layer that is to be separated. The InGaAs/GaAs, SiGe/Si, and InGaP crystalline systems have been used, as have Au/Ti, Ni/Ti, Ge/Ni twin-layers (Nanotechnology 16 (2005) 908-912) and, more generally, insulator/metal two-layer systems have been reported in the literature (O. G. Schmidt, Adv. Mat. 13 (2001) 756, P. O. Vaccaro et al., Appl. Phys. Lett. 78 (2001) 2852).

The process corresponding to the last of these techniques consists in depositing a sacrificial layer, which may be of aluminum for the Au/Ti system, onto a suitable substrate. Then a twin layer with different lattice parameters $a1>a2$ is deposited by MBE. The twin layer is then released from the substrate by selective chemical attack, which starts separation of the film. The stress may be relaxed, and the film begins to roll up on itself. If the selective attack on the sacrificial layer is continued, the film continues to roll up and a multilayer nanotube is obtained. The key to those approaches is depositing two crystalline layers that are stressed because of a lattice parameter mismatch.

An additional lithography step may be added, enabling nano-objects of various shapes to be obtained (V. Ya. Prinz, et al., Nanotechnology 12 (2001) 399-402).

The majority of those self-constructed objects are semiconductor heterostructures. Other systems have also been studied, however, such as Au/Ti.

The nano-objects created in that way can be left on the substrate or totally separated by chemical attack (Adv. Mater. 2001, 13, No. 10, 756-759). The stress may be introduced by means of a chemical composition gradient. This has been demonstrated on cantilevers of Si doped with Br. It should be noted that this approach separates the nanostructure only partially.

The patent documents U.S. Pat. No. 6,593,065 and WO-A-2004/086461 describe methods of fabricating nano-structures that use etched substrates in the form of plateaus or mesas (i.e. tabular structures) that are interconnected by channels.

A major drawback of the above-mentioned techniques for fabricating nanostructures, such as nanotubes or nanofilaments, is that they generally require chemical treatment steps for satisfactory individual release of the nanostructures from the substrates used.

An object of the present invention is to propose a method of fabricating a nanostructure, comprising the following steps:
  prestructuring a substrate adapted to receive said nanostructure to form a nanorelief on said substrate, said nanorelief having flanks extending from a bottom of said substrate and a top face extending from said flanks, and then
  depositing directly on said substrate prestructured in this way a single-layer or multilayer coating that is sufficiently strong to form said nano-structure;
thereby in particular removing the above-mentioned drawback.

To this end, the fabrication method according to the invention further comprises:
  adding to said prestructured substrate, over at least a portion of its surface, or to said coating, a separation layer adapted to enable total or partial separation of said coating and said substrate by external action of mechanical, thermomechanical, or vibratory type; and
  exerting this external action on said substrate and/or said coating to recover selectively for said nano-relief a top portion and/or a recessed portion of said coating respectively corresponding to said top face and/or said bottom of the substrate by separating this portion from the remainder of said coating deposited on said substrate so that said top portion and/or said recessed portion recovered in this way constitute(s) some or all of said nanostructure.

This external action associated with said separation layer has the advantage of facilitating complete or partial separation of the nanostructures formed by these coatings from the substrate.

The term "directional deposition" excludes "conformal" deposition, i.e. techniques that cover the target with a uniform layer independently of the local orientation of each element of its surface (as with chemical deposition, for example CVD), and here, in contrast, refers to any deposition by techniques that cover the target with a maximum thickness on surface elements orthogonal to a preferential deposition direction and with zero or quasi-zero thickness on surface elements parallel to that direction, such as physical vapor phase deposition (for example the techniques of evaporation in an ultrahigh vacuum used in molecular beam epitaxy or cathode sputtering).

The materials usable for said coatings in accordance with the invention are such that:
  the nanostructures are sufficiently robust mechanically, being at least self-supporting, and, simultaneously;
  by virtue of the above-mentioned directional deposition, the flanks of the nanoreliefs virtually perpendicular to the corresponding top faces receive little or no deposited material, so that the portions situated on the top faces and/or the bottom of the substrate are very easily separated from each other (for example, the thickness of any residual deposit on these flanks, on average over the surface of the flanks, is less than 5% of the thickness of the coating deposited on the top face and/or the bottom of the substrate and also has a very irregular thickness because deposition on the flanks is at practically grazing incidence).

It should be noted that the shape of the nano-structures separated from the substrate in this way is determined by the shape of the nanoreliefs initially defined on said substrate, which provides a very wide range of possible shapes for these nanostructures, in contrast to the known techniques for fabricating nano-filaments, for example (e.g. nanofilaments of carbon or silicon, nanofilaments prepared by electrodeposition via porous membranes).

It should also be noted that this method of the invention is applicable to any nanostructure composition, whether of crystalline, polycrystalline or amorphous type.

It should further be noted that the nanostructures fabricated by this method according to the invention may be described as self-supporting in that they may be separated from said pre-etched (i.e. pre-structured) substrate. For some applications, these nanostructures may then be applied to another surface, in the way that ink may be deposited on a pad and then applied to another surface. This method may be highly advantageous in microelectronics, in particular for the production of certain metallic interconnection layers.

Thin layers forming said coating deposited on a pattern formed on said pre-etched substrate by lithography and etching techniques may advantageously be combined. The nanostructures formed by these coatings are then totally or partially separated from said substrate by the above-mentioned external action of mechanical, thermomechanical, or vibratory type.

According to one particular advantageous aspect of the invention, this separation of the nanostructures with a view to recovering them in ordered packets or individually is facilitated by the presence of said separation layer between said substrate and said coating, and necessitates no selective chemical or ion etching.

According to another advantageous feature of the invention, said nanostructure obtained may include a first portion of nanoscopic type and a second portion of microscopic or macroscopic type, which is formed by a pattern designed during lithography and is usable for manipulating said nanostructure individually.

It should be noted that this second portion greatly facilitates manipulating the nanostructure, compared to standard nanofilament fabrication techniques, and produces an individual nanostructure or ordered nano-structures.

It should further be noted that partial separation of the nanostructure formed in this way provides a solution to the problem of connecting a nanostructure to and/or integrating a nanostructure into an MEMS device or an NEMS (nano-electromechanical system) device, for example.

According to another feature of the invention, said coating deposited on the top face of said nanorelief is grown substantially in the direction of the thickness of said coating, measured from said top face.

In fact, one peculiarity of nanostructures such as nanofilaments produced by the method of the invention is that they have interfaces parallel to the plane of the nanostructure, unlike nanofilaments prepared using porous membranes (for example by electrodeposition), in which the interfaces are parallel to the section of the nano-filament. This difference stems from the fact that a nanofilament obtained in accordance with the invention is grown in the direction of its thickness, whereas in the methods known in the art the nanofilament is grown in the direction its length.

According to another feature of the invention, said nanorelief may take the form of an elongate plateau having flanks that co-operate with the bottom of said substrate and/or with said top face to form one or more clearance or undercut angles in the range 60° to 120°.

It should be noted that such oblique flanks could be designed to confer a locally smaller thickness on the recovered nanostructure. Two oblique faces may equally be associated face to face, in order to obtain a nano-structure with a trapezoidal or triangular section perpendicular to the plane of the substrate (the widest face of this nanostructure still being that farthest from the substrate).

Said pre-etched substrate according to the invention may thus include one or more of these plateaus, usually referred to as mesas by the person skilled in the art, i.e. finite and very flat surfaces that are raised relative to their surroundings, being delimited by steep flanks, which therefore have substantially the shape of the nanostructures to be produced. Said coating is then deposited at the same time on the tops of the mesas and on the bottoms of the channels or trenches separating the mesas, after which the coating is totally or partially separated from the tops of the mesas or from the trenches by stresses generated during the above-mentioned external action.

According to one embodiment of the invention, said top face (i.e. the top face of the mesa) may be substantially plane.

According to a variant embodiment of the invention, said top face may include a secondary nanorelief that has characteristic dimensions smaller than those of said nanorelief and has secondary flanks terminated by a top that are less steep than those of said nanorelief.

According to a first feature of this variant of the invention, the or each layer of said coating may have a section of curved shape relative to a transverse or oblique plane of said nanorelief and, by way of an example of this first feature, the secondary flanks of said secondary nanorelief may be at an angle substantially equal to 45° and define a pre-etched depth greater than the thickness of said deposited coating. This is easily obtained by carrying out a second step of partial etching of the substrate to a depth and with a steepness of the flanks compatible with the solidity of the finished nano-object.

Still according to this variant, and where applicable in combination with said first feature thereof, a locally smaller thickness may be imparted to a layer or to each of the layers that constitute the coating intended to form the nanostructure. This is easily obtained by carrying out a preliminary step of partially etching the substrate to produce an etched flank locally forming an angle θ with the surface of the substrate or of said top face of the mesa; each layer of thickness $e_0$ deposited to form the nanostructure then has, at the location of that flank, a thickness e' such that $e'=e_0 \cos \theta$.

To summarize, the plane surface forming said top face (i.e. the summit) of a mesa may itself be structured by partial etching or chemical attack to impart to it a nanostructure form, the steepness of the flanks being made sufficiently small to ensure that the finished nano-object is cohesive. This enables the production of nano-objects that can have a three-dimensional structure rather than a plane structure.

Said starting substrate may consist of any material that can be prestructured on the scale of a few tens of nanometers and on which the coating intended to form the self-supporting nanostructure according to the invention may be deposited.

A silicon-based substrate is advantageously used, as techniques for etching silicon are extremely well proven. Thus mesas can be prepared in silicon that are delimited by extremely steep flanks, even undercut (i.e. "overhanging").

The preparation of pre-etched silicon substrates is described in various papers (see for example: Domain structure of magnetic layers deposited on patterned silicon, S. Landis, B. Rodmacq, B. Dieny, B. Dal'Zotto, S. Tedesco, M. Heitzmann, Applied Physics Letters 75, 2473 (1999) or Magnetic properties of Co/Pt multilayers deposited on silicon dot arrays, S. Landis, B. Rodmacq, B. Dieny, Physical Review B, 62, 12271 (2000)).

This step of pre-etching the substrate may include the following steps.

A uniform 600 nm deposit of a positive resin is produced on the substrate. The resin is exposed lithographically in accordance with the required pattern. Electron or U.V. lithography is used, according to the required resolution. It is at this stage that the nano-metric dimensions are fixed (in one direction at least). Electron lithography produces 10 nm lines and a lateral resolution of 25 nm can be achieved by the nano-imprint process (C. R. K. Marrian et al., J. Vac. Sci. Technol., A, Vac. Surf. Films 21 (2003) S207).

In the method of the present invention, the mesas are given the shape of the nanostructures to be produced. It may be a question of lines, grids, rings, networks of lines or complex patterns associating certain portions that have nanometric dimensions with other portions that have microscopic or macroscopic dimensions. Chemical attack then removes the exposed portion of the resin. Chemical or ion etching, preferably reactive ion etching (RIE), etches the substrate as a function of the pattern produced on the resin, producing very steep etched flanks. Very high form factors or ratios (at least equal to 10) can be obtained in this way, the form factor being defined as the ratio between the depth of a recessed portion obtained between two adjacent nanoreliefs and the minimum width, which is chosen as either the width of the corresponding top portion and/or that of the recessed portion.

Under certain conditions it is equally possible for the etching mechanisms to produce pre-etched patterns in substrates with dimensions smaller than the resolution of the lithography process used.

To impart a three-dimensional structure (rather than a plane structure) to the nano-objects to be separated from the tops of the mesas, it is necessary to carry out a plurality of steps of etching or attacking said substrate to produce flanks with different inclinations and/or heights, there being very steep flanks delimiting the mesas that delimit the edges of the nano-object to be separated and less steep secondary flanks imparting the 3D structure to the nano-objects. The techniques to be used for this prestructuring of the substrate are well-known to the person skilled in the art. They necessitate the ability to align the two types of nano-structure correctly relative to each other. Certain chemical attack techniques known to the person skilled in the art (for example KOH attack on Si(111)) are well adapted to the production of inclined flanks in silicon, whereas other techniques, such as reactive ion etching, are better adapted to producing vertical or even undercut flanks. The various layers are then deposited on the pre-etched substrate to form the main structure.

The step of pre-etching the substrate preferably uses a reactive ion etching technique.

It should nevertheless be noted that the method according to the invention could use any other method of obtaining pre-etched substrates as defined above.

According to another feature of the invention, the addition of this separation layer to said pre-etched substrate or said coating is carried out as follows.

There are several techniques for encouraging separation of the coating deposited on the pre-etched substrate.

In a first embodiment of the invention, said pre-etched substrate is covered with said separation layer, after which said coating is deposited on said separation layer.

According to this first embodiment, said separation layer may advantageously be added to said substrate by adsorption of a non-stick molecular layer thereon, e.g. based on a material chosen from the group consisting of polytetrafluoroethylene (such as "Teflon"), $C_4F_8$, and $CF_2$.

According to a variant of this first embodiment, if said substrate is based on silicon dioxide, the separation layer may be a layer that is adapted to form a low bonding energy interface (i.e. weak chemical bonds) with said pre-etched substrate and that is based for example on one or more noble metals chosen from the group consisting of gold, silver and platinum, because these noble metals will have little tendency to oxidize. Thus a thin layer of Au or Ag may be deposited on the silicon dioxide. The $SiO_2/Au$ or $SiO_2/Ag$ interface will separate relatively easily if stress is then applied to the deposited layer.

According to a second embodiment of the invention, said separation layer is added to said coating to be deposited on the pre-etched substrate in such a manner that this separation layer forms an internal sub-layer of said coating covering said substrate during deposition. For example, the separation layer may consist of a material deposited by physical vapor deposition (PVD) at the start of deposition of the material constituting the nanostructure to be separated, for example.

According to another feature of the invention, there may further be incorporated, locally between said pre-etched substrate and said coating, a fixing or attachment layer that has a high bonding energy interface (i.e. strong chemical bonds) with the substrate, so that a portion of said coating remains fixed to said substrate, and is of tantalum or titanium, for example, if said substrate is based on silicon dioxide. In fact, tantalum and titanium have high affinities for oxygen, which explains the strong adhesion of these materials to silicon dioxide.

For certain applications, it may be advantageous to produce nanostructures that will be locally separated from the substrate and remain bonded to said substrate at other locations. This may be beneficial for the production of certain actuators, for example. To this end, masking techniques using resins (lithography/dissolution of resin) are employed to deposit at certain locations a separation layer encouraging separation and at other locations a fixing layer encouraging attachment. Application of stress could be combined with deposition of a separation layer enabling separation, such as a $C_4F_8$ or $CF_2$ layer, for example. A layer of platinum, silver or gold may also be used. More generally, a layer that is not oxidizable or that has no strong chemical bonds with the substrate or the adjacent layers is introduced into the stack.

It is clear that, using this approach, the thin layers deposited from above are not epitaxial layers.

According to the invention, the thin layers forming said coating are deposited as a function of the required function of the nanostructure. These characteristics are a function of the natures of the layers deposited and also of the shape of the nanostructure.

This step of depositing the coating intended to form the nanostructure on the pre-etched substrate is preferably effected by a cathode sputtering technique.

As indicated above, this deposition may be effected on the pre-etched substrate covered with said separation layer, which may alternatively be integrated directly into the sequence of deposits of these thin layers, as indicated above. Thus mention may be made in particular of a separation layer based on a noble metal such as gold that is afterwards covered with other layers produced by the same technique as is used to deposit the gold, for example cathode sputtering or another PVD technique.

It should be noted that it is possible to use a vast choice of materials for said coating of the method according to the invention (metallic materials, metallic oxides, nitrides, semiconductors, etc.), provided that there is not necessarily a requirement for epitaxial growth of the material. By way of non-limiting example, polycrystalline or even amorphous deposits are suitable for many applications, such as NEMS and magnetoresistive nanofilaments.

The only constraint imposed by the method according to the invention is that, to enable a posteriori separation of the deposited coating, said coating must be deposited on said separation layer (whether it be added to said pre-etched substrate or to said coating). This constraint may slightly complicate obtaining epitaxial deposits, but does not impact on obtaining polycrystalline or amorphous deposits.

Said coating must be deposited using a technique that does not yield a conformal deposit, but on the contrary a deposit that is sufficiently directional to feature a discontinuity on the flanks of the mesas that delimit the edges of the nanostructure. Most PVD techniques may be considered sufficiently directional in that the pressure at which the deposits are effected is such that the mean free path of the species deposited during their passage from the target to the substrate is of the order of or greater than the target-substrate distance. This generally applies with all ultrahigh vacuum PVD techniques, and also with more standard techniques such as cathode sputtering, usually carried out at pressures of the order of $2\times10^{-3}$ mbar of argon.

With the preferred cathode sputtering technique, the angular dispersion of the species reaching the substrate for a distance of the order of 10 cm may be of the order of plus or minus 20° around the normal to the target. If the target is parallel to the pre-etched substrate, the flux of species arriving from the target is substantially normal to the plane of the substrate with a low angular dispersion around that normal.

According to the invention, the above-mentioned external action on said substrate and/or on said coating may be exerted:

Via a mechanical action comprising the application of twisting and/or bending and/or cleaving stress to said substrate. The starting substrates may be thinned silicon substrates (a few microns thick), which are easy to bend. The substrates may also be pre-etched to the required shape. Bending the substrate applies a stress to the deposited layer which then separates from the substrate if its adhesion thereto is low.

Via a thermomechanical action resulting from the differences between the respective coefficients of thermal expansion of said coating and said substrate. This may be obtained, for example, by depositing the coating at a temperature sufficiently different from room temperature and using a substrate that has a coefficient of thermal expansion different from that of the deposited materials. When the deposition of the coating is finished and the sample has "thermalized" at room temperature, the stresses of thermal origin linked to the thermal expansion difference between the deposit and the substrate appear. They may suffice to separate the deposited coating from the substrate. The coating may be deposited hot (typically at a temperature above 80° C. or 100° C.) or cold. Certain cathode sputtering frames enable cooling of the substrate with liquid nitrogen, for example, so that the substrate is at approximately −150° C. during deposition of the coating. Multilayers of Ag/(NiFe 2 nm/Ag 1 nm) 50 deposited at −150° C. on naturally oxidized silicon separate spontaneously from the substrate on returning to room temperature. Similarly, another possibility is to deposit the coating at room temperature and then to cool or to heat the coating to encourage its separation.

Via a vibratory action, for example transmission of ultrasound to the substrate covered with the coating to generate mechanical stresses for separating said coating.

The step of selectively recovering the top portion of said coating (i.e. the portion deposited on the top of a mesa) by separating it from the top face of said or at least one of said nanoreliefs (i.e. from the top of the mesa) is advantageously totally free of chemical or ionic attack. The same applies if the portion at the bottom of the substrate (e.g. at the bottom of the trenches) is to be recovered.

In fact, the method according to the invention produces total or partial separation of the nano-object from the substrate without having recourse to a new step of chemical or ionic etching of a "buffer" layer after deposition of the coating that is to be separated, in contrast to the approach developed by the O. G. Schmidt team at the Max Planck Institute (Adv. In Solid State Phys. 42, pp. 231-240, 2002 B. Kramer (ed)), in which the deposit is separated by chemically attacking a sacrificial layer.

In the method of the invention, total or partial separation of the nanostructure is obtained by virtue of the weak chemical bonds between the substrate and the material of said deposited separation layer and from utilizing the stresses present between the layers of said coating or between the substrate and those layers. The deposited separation layer having a low adhesion, mechanical action suffices to provide the necessary energy for separating the nanostructure.

The nanostructure fabrication method of the invention enables the production of all kinds of nano-objects, in particular in the field of NEMS, for example:

arrays of copper nanofilaments produced by depositing a multilayer copper coating on a gold-based non-stick separation layer;

stacks of metal/insulator/metal nanofilaments, to obtain waveguides (for example the thickness of the silicon dioxide layer may be varied with a monomode fiber having a diameter of the order of 200 micrometers (μm), a graded index fiber with a diameter of 50 μm to 100 μm or a stepped index fiber with a diameter of the order of 10 μm);

bimetallic strips with their curvature controlled by a magnetic field, produced by combining materials with different magneto-elastic properties;

magnetoresistive nanofilaments produced by depositing GMR (giant magnetoresistance) materials (spin valves or GMR multilayers) on substrates prestructured in the form of lines; and near field microscope points having specific properties (e.g. heating points, magnetic points sensitive to magnetic walls).

Said nanostructure obtained is advantageously chosen from the group consisting of nanofilaments, nanopoints with various functions for near field microscopes, in particular heating nanopoints or magnetic nanopoints with high wall contrast, nanowaveguides, magnetorestrictive sensors, metallic interconnections, and bimetallic strips with their curvature controlled by magnetic fields.

Said nanostructure obtained is even more advantageously chosen from the group consisting of arrays of copper nanofilaments, waveguides consisting of metal/insulator/metal composition nanofilament stacks, magnetoresistive nanofilaments consisting of giant magnetoresistance materials, for example, and copper or aluminum interconnection lines intended to be pressed inverted onto a CMOS stack.

According to another advantageous feature of the invention, the nanostructures obtained by said fabrication method may be applied to another substrate or another set of layers in the manner of an ink stamp, for example to produce a layer of copper interconnection lines obtained by applying to a CMOS stack (on which the interconnections must be deposited) a copper nano-structure previously separated from an array of mesas and designed to have the shape of the interconnections.

It should further be noted that the pre-etched substrates used for fabricating self-supporting nano-structures by the method of the invention may be re-used in the manner of nano-imprint molds. If the coating deposited on the substrate and remaining in the bottom of the trenches (i.e. between the mesas) after separation is not an obstacle to re-use of the substrate, because it is very thin compared to the height of the mesas and strongly adherent, then the substrate may be re-used as such until such time as too great a thickness of coating has accumulated in the bottom of the trenches. In contrast, if this residual coating does constitute an obstacle, the substrate must be cleaned before re-use (for example by a chemical attack that attacks the remaining deposit without attacking the substrate).

The above-mentioned features of the present invention, and others, can be better understood on reading the following description of embodiments of the invention given by way of non-limiting illustrative example and with reference to the appended drawings, in which.

Figure 1:
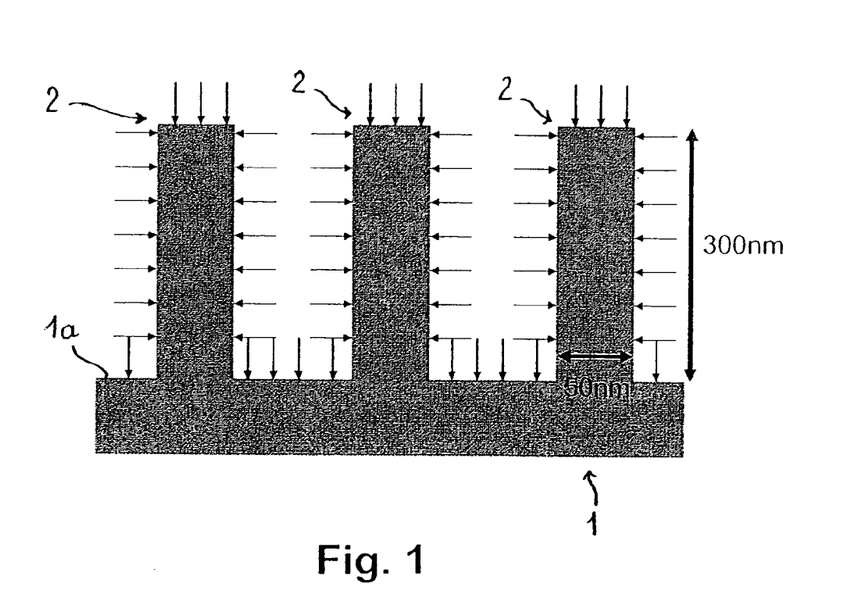
FIG. 1 is a diagram showing a first stage in the production of mesas in accordance with the invention on a substrate, before isotropic etching.
Figure 2:
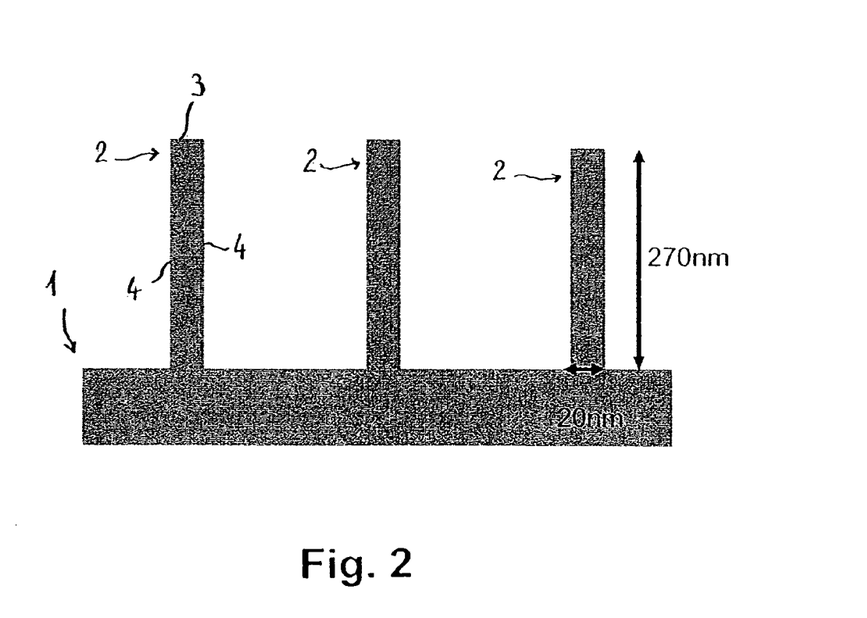
FIG. 2 is a diagram showing a second stage in the production of mesas as in FIG. 1, after isotropic etching, producing mesas having dimensions smaller than the resolution of the lithographic process used.

As shown in FIGS. 1 and 2, starting with a silicon substrate 1, and by electron lithography and reactive ion etching, it is possible to produce nanoreliefs or mesas 2 in the form of parallel rows 50 nm wide and 300 nm high as measured from the bottom 1a of the substrate 1 (see FIG. 1). Then, during a step of isotropic etching of the silicon, the tops 3 and the flanks 4 of the mesas 2 may be simultaneously attacked perpendicularly to their surface (see FIG. 2). This isotropic etching reduces the height of the mesas 2, but simultaneously reduces their width. Mesas 2 are thus obtained with dimensions smaller than the resolution of the lithographic process used.

Figure 3:
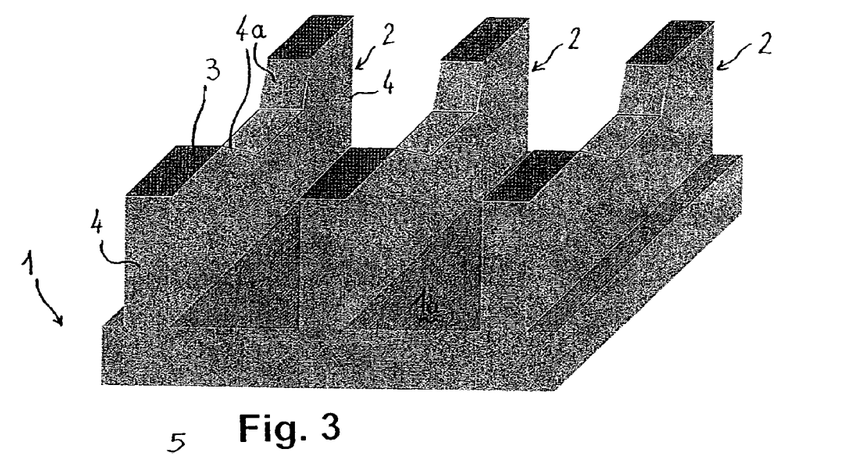
FIG. 3 is a diagrammatic perspective view of one example of a pre-etched substrate that is doubly nano-structured via each of its three mesas, with a view to obtaining a three-dimensional nanostructure in accordance with the invention.
Figure 4:
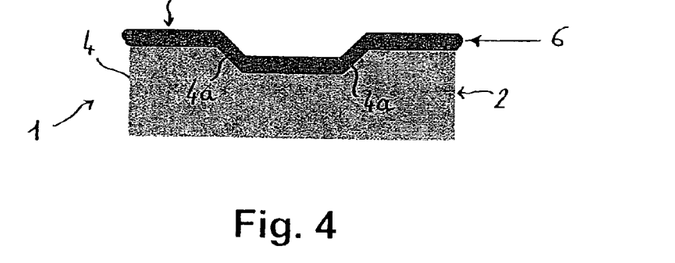
FIG. 4 is a diagrammatic view in section of a coating deposited in accordance with the invention on one of the three mesas of the pre-etched substrate from FIG. 3, which one mesa is itself nanostructured.

FIGS. 3 and 4 show an embodiment of a nano-structure 5 wherein the top face 3 of each nanorelief or mesa 2 (i.e. the top of each mesa) is not plane and has a three-dimensional structure. For this the substrate 1 has been pre-etched twice (see FIG. 3) with, firstly, steep flanks 4 delimiting the edges of each mesa 2 and, secondly, less steep secondary flanks 4a on each top face 3, imparting a 3D shape to the nanostructure 5 after separation of the coating 6 deposited on the faces 3 (see FIG. 4).

Figure 5:
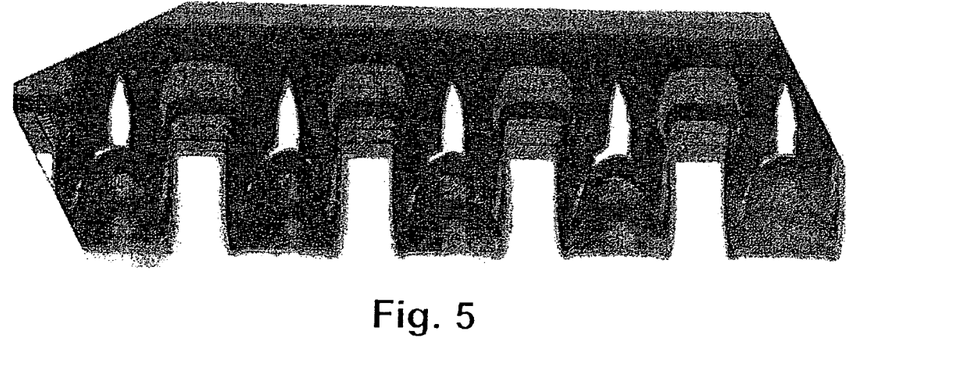
FIG. 5 is a transmission electron microscope view in section of magnetic multilayers deposited in accordance with the invention on a naturally oxidized silicon substrate pre-etched in the form of parallel rows, with a tantalum-based fixing layer adhering to said substrate.

FIG. 5 shows a coating with magnetic multilayers deposited on a naturally oxidized silicon substrate pre-etched in the form of parallel rows, with a tantalum-based fixing layer adhering to said substrate. This tantalum layer therefore forms strong chemical bonds with the silicon oxide of the substrate to ensure satisfactory adhesion of the coating deposited on the substrate at the location of this fixing layer, and therefore to prevent subsequent separation of the coating at this location.

Figure 6:
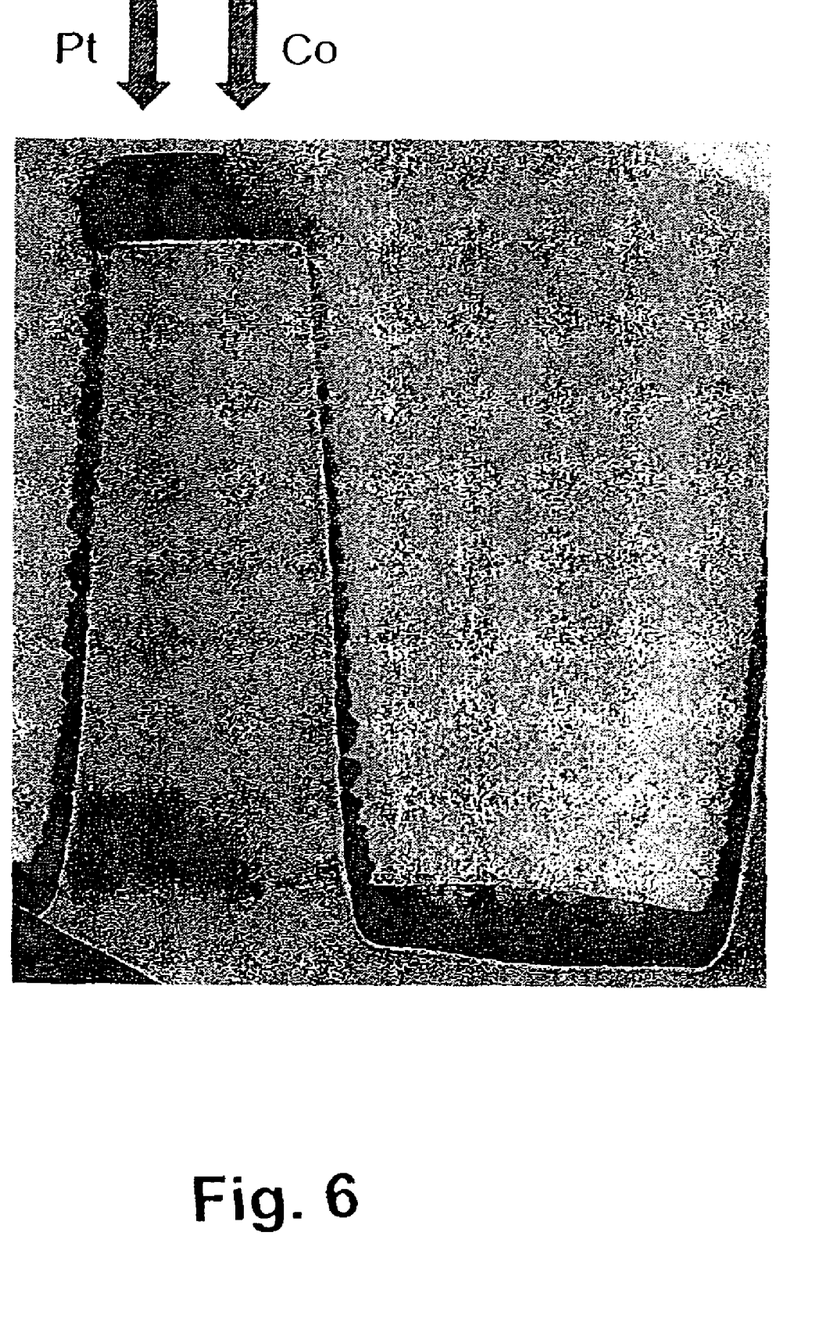
FIG. 6 is a transmission electron microscope view in section of one example of Pt/Co multilayers deposited in accordance with the invention on a pre-etched silicon substrate in the form of mesas in parallel rows.

The FIG. 6 image illustrates the structure of a coating deposited by cathode sputtering and shows the multilayer deposited on top of the mesas and in the bottom of the trenches separating the mesas. FIG. 6 is a transmission electron microscope image showing in section a multilayer 14 (here Pt 2 nm/Co 0.5 nm) deposited on a silicon substrate that has been pre-etched in the form of mesas in parallel rows. The width of the lines of silicon is 75 nm and their height is 300 nm. The coating deposited on the flanks of the mesas has a granular appearance because it has been deposited at grazing incidence to the flanks, given that during deposition the flux of material arrives substantially perpendicularly to the plane of the substrate. The deposit on the flanks is therefore discontinuous, because of its granular texture. Consequently, during the subsequent operation in accordance with the invention of separating the coating covering the tops of the mesas, the coating deposited on the tops of the mesas may be physically separated from that deposited at the bottom of the trenches. This is what is has happened to produce the FIG. 7 nanofilaments.

Figure 7:
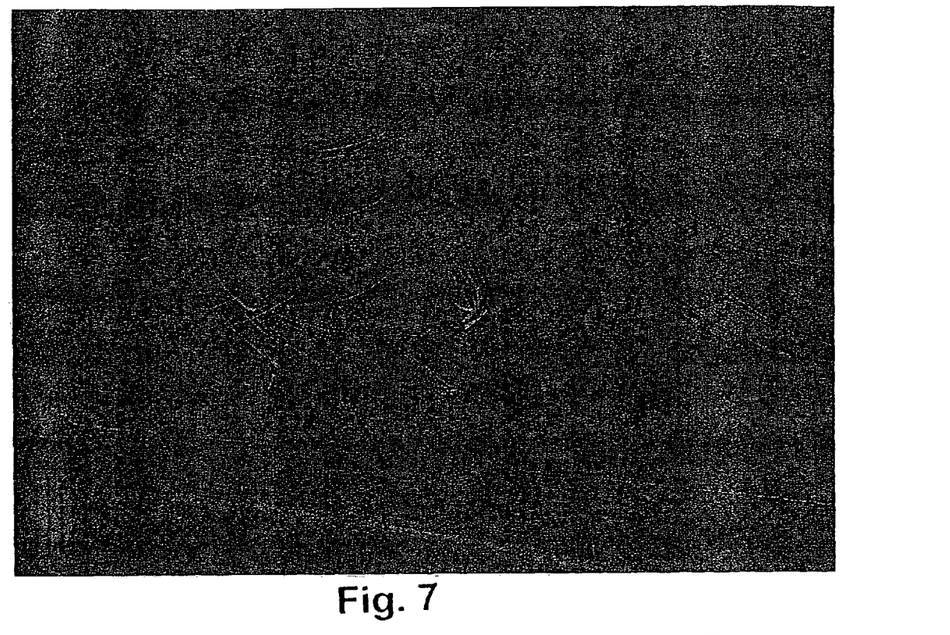
FIG. 7 is a scanning electron microscope view of a set of metallic magnetic nanofilaments obtained in accordance with the invention by depositing metallic magnetic multilayers with an adhesive separation layer based on gold on a naturally oxidized silicon substrate pre-etched in the form of parallel rows.

The FIG. 7 nanofilaments are produced on a substrate pre-etched in the form of parallel rows 100 nm wide with an edge-to-edge spacing of 100 nm, separated by 300 nm trenches, and covered with a non-stick separation layer based on a noble metal (gold). Because the chemical bonds between gold and silicon oxide are weak, the multilayer coating deposited on the tops of the mesas has separated after cleaving the substrate, forming the nanofilaments observed in FIG. 7.

Even if the coating deposited on the flanks is not perfectly discontinuous, it is clear that, if these flanks are nearly perpendicular to the tops of the mesas, given the directional character of deposition in accordance with the invention, the areas of continuity are very thin compared to the thickness of the coating deposited on surfaces parallel to the plane of the substrate (the tops of the mesas in particular). Consequently, during separation, the coating deposited on the flanks constitutes an area of weakness that breaks easily, unlike the coating deposited on the tops of the mesas. This is facilitated by the strength of the various coating layers deposited and by the sharp corners between the top or bottom plane faces (e.g. the bottoms of the trenches) and the adjacent flanks extending from these bottom faces.

Figure 8:
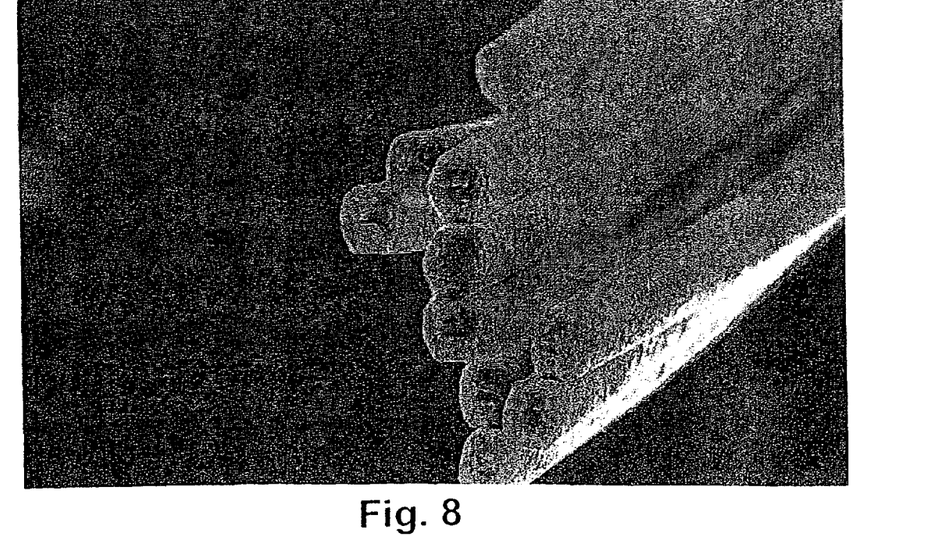
FIG. 8 is an electron microscope view of magnetoresistive nanofilaments obtained in accordance with the invention, following separation of a deposit of magnetoresistive multilayers formed of a spin valve type Pt/NiFe/Co/Cu/Co/NiFe/IrMn stack on a silicon substrate naturally oxidized on the surface and pre-etched in the form of parallel rows.

FIG. 8 is a scanning electron microscope image of one example of magnetoresistive nanofilaments obtained by separating spin valve type materials:

Pt/NiFe 3 nm;
Co 1 nm;
Cu 2.5 nm;
Co 1 nm;
NiFe 2 nm;
IrMn 7 nm;
Pt 3 nm;

with networks of parallel rows similar to those of FIGS. 5 and 7. To be more precise, spin valve deposition begins with the deposition of a platinum-based separation layer that adheres weakly to the silica, which encourage the subsequent separation of nanofilaments formed in this way.

Figure 9:
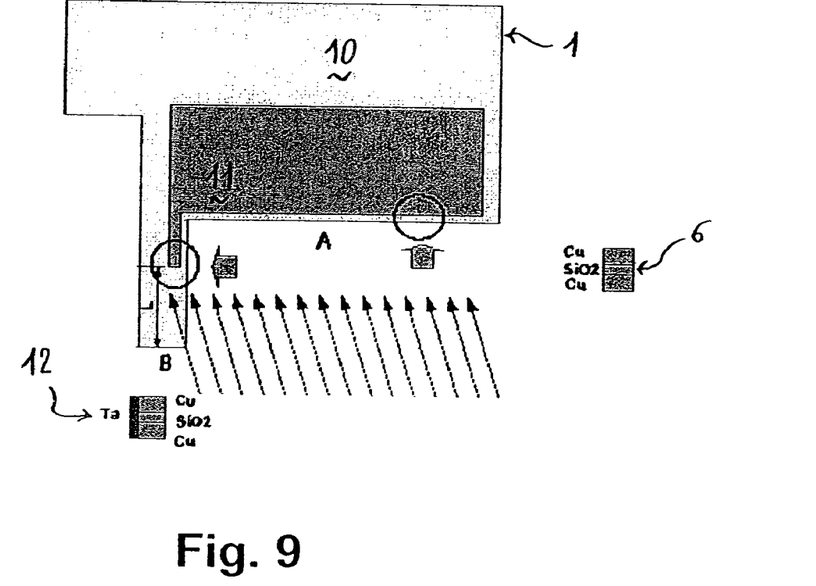
FIG. 9 is a diagrammatic plan view showing the implementation of the various steps of the method according to the invention for fabricating heating nano-points.

Examples of Production of Nanopoints with Specific Properties for Near-field Microscopy The method of the invention has been used to fabricate various near-field microscopy points (heating points and magnetic points with a high wall contrast and high resolution).

a) Fabrication of a Heating Nanopoint (see FIG. 9)

In this embodiment, the nanopoint consists of a nanoscopic portion that is intended to interact with the sample and a microscopic portion that is intended to enable manipulation of the nanopoint and fixing thereof to the cantilever of the near-field microscope. The nanoscopic portion (i.e. the point) and a micron or sub-micron portion are obtained lithographically.

A silicon substrate 1 is pre-etched beforehand to produce the pattern 10 indicated in FIG. 9. This pattern 10 is therefore the portion in the form of a trench in the substrate 1.

A 10 nm non-stick separation layer of platinum that encourages subsequent separation of the coating is then deposited on the native silicon oxide, over the whole of the sample, using a PVD technique (cathode sputtering).

Using a resin mask, a coating 6 formed of a Cu 10 nm/SiO$_2$ 40 nm/Cu 10 nm multilayer "sandwich" (the thicknesses are given here by way of orders of magnitude), is then deposited over the whole of the etched area 10, this deposition being effected at an incidence substantially perpendicular to the plane of the substrate 1. The active portion (heating point) corresponds to the area 11 in FIG. 9.

It should be noted that the distance L separating the etched edge from the silicon in the area A in FIG. 9 is much smaller than that in the portion B, which represents the apex of the point.

The final deposition step consists in depositing a layer 12 of tantalum or of some other highly resistive material at oblique incidence, to create a short-circuit only in the nanometric part. The angle of incidence for depositing the tantalum layer 12 relative to the plane of the substrate 1 must be such that this layer 12 covers all of the Cu/SiO$_2$/Cu edge in the portion B, but this angle is zero elsewhere because of the shading effect due to the plane of the substrate 1.

Accordingly, only the apex B of the point is bypassed by the tantalum layer 12. Of course, tantalum is also deposited onto the top Cu layer, but this is not a problem.

The coating 6 deposited on the area 11 is then separated and the Pt/Cu layer on one face of the macroscopic portion of the nanostructure is brought into electrical contact with the Cu/Ta layer on the opposite face.

If an electrical voltage is applied between the two contacts on either side of the SiO$_2$ insulative layer, current flows in one of the metallic layers to the apex B of the point, through the tantalum layer 12 deposited on the apex B, and leaves via the opposite metallic layer. As the most resistive portion of the electrical circuit is the tantalum layer 12 at the apex B of the point, very localized heating occurs there.

It should be noted that, by combining local heating with the application of a moderate magnetic field, this type of nanopoint can advantageously be used to write information on a magnetic medium thermomagnetically, for example.

b) Fabrication of a Magnetic Nanopoint with High Wall Contrast

Figure 10:
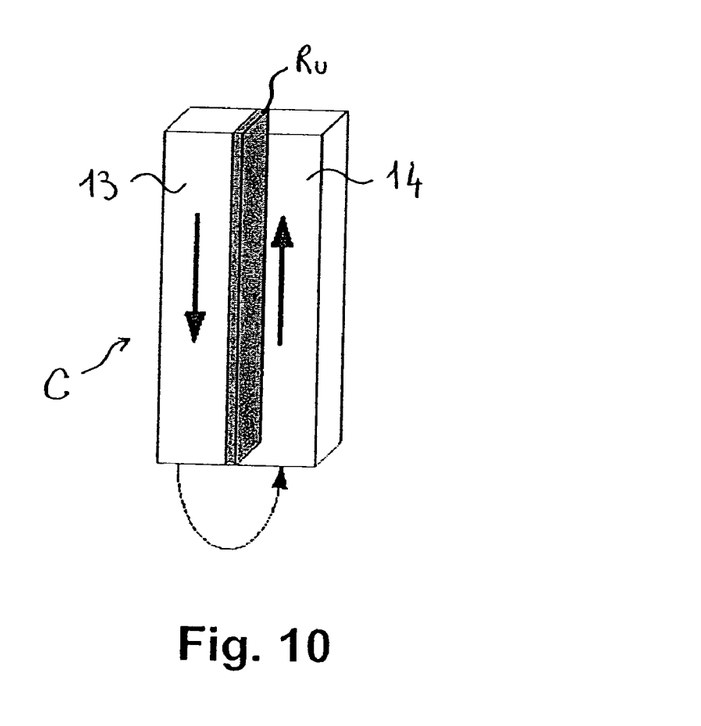
FIG. 10 is a diagrammatic perspective view of one example of a nanostructure in accordance with the invention that can be used in a magnetic force microscope point to obtain a wall contrast with a very high resolution.

FIG. 10 shows another example of producing points for magnetic force microscopy. The shape of the point C may be similar to that from FIG. 9, but here the material deposited is as follows:

Pt 10 nm (separation layer);
CoFe 3 nm/Ru 0.7 nm/CoFe 3 nm/SiO$_2$ 50 nm (coating).

In fact, ruthenium (Ru) is known to induce high antiferromagnetic coupling between the magnetizations of the two CoFe (90/10) magnetic layers 13 and 14 for thicknesses of the order of 0.4 to 1 nm. Consequently, the magnetizations of the two CoFe layers 13 and 14 remain strongly antiparallel to each other.

If such a point C is moved towards a thin magnetic layer, it will be sensitive to the magnetic walls of the medium. In fact, as the overall magnetic moment of the point C is zero, this magnetic moment cannot be responsive (at the scale of the point C) to the effect of the uniform magnetic field radiated by the magnetic domains. In contrast, at the level of the walls separating two domains, the point C is subject to a force that could be detected.

This type of point can offer high sensitivity to walls with very good spatial resolution (of the order of a fraction of the thickness of the CoFe layers). This thickness can vary from a fraction of a nanometer to several nanometers, as a function of the sensitivity and the resolution required. In the stack, the layer of SiO$_2$ has the function of stiffening the point (to prevent it from being deformed when it moves on the surface of the sample, because of the effect of the topology of the surface or of the action of the radiated magnetic field). Any other rigid non-magnetic material may provide this function (oxides in general, such as SiO$_2$, Al$_2$O$_3$, HfO$_2$, etc., or nitrides, such as TiN and WN), to short-circuit the two copper electrodes only at the end of the nano-scopic portion.

Use of the Method According to the Invention for the Production of Metallic Layers in Microelectronics Certain steps of the CMOS technique, such as the production of a metallic interconnection layer, could be conducted using the nanostructure fabrication method according to the invention. The principle of this use of the method of the invention is as follows.

It consists in taking a substrate pre-etched in the form of mesas having tops with the shape of all the interconnections to be produced in the layer concerned, and initially depositing thereon a separation layer that is weakly adherent to the deposited material (for example a copper layer), followed by a coating of this material to provide the interconnections.

In contrast, a layer that adheres strongly to the last layer on which the interconnections must be produced (for example of SiO$_2$ with localized lines of copper) is redeposited onto the deposited material. The pre-etched substrate is then inverted and applied to the material deposited on the CMOS wafer that is to receive the interconnection layer. Alignment must be controlled very accurately for the interconnections to be in the proper places.

This type of technology is the same as that used in the nano-imprint technique, where the same type of alignment is necessary for the production by nano-imprinting of technological steps above the levels already produced. Again as in nano-imprinting, pressing encourages adhesion of the deposit on the tops of the mesas to the top layer of the CMOS wafer. Since a layer is provided to encourage this adhesion (for example a layer of tantalum, which adheres well to $SiO_2$), the nano-structures on top of the mesas separate from the initial substrate and bond to the CMOS wafer at the required locations. This technique is therefore similar to depositing ink on a pad which is then pressed onto a sheet, on which the ink is deposited.

The invention claimed is:

1. A method of fabricating a nanostructure, comprising:
prestructuring a substrate to form a nano-relief on said substrate, said nanorelief having flanks extending from a bottom of said substrate and a top face extending from said flanks;
directionally depositing on the prestructured substrate a single-layer or multilayer coating that is sufficiently strong to form said nanostructure, said directionally depositing includes having a deposited flux arrive at grazing incidence to said flanks and substantially perpendicular to said bottom so that the deposited flux on the substrate is not conformed but discontinuous on said flanks;
adding to at least a portion of a surface of said prestructured substrate, or to said coating, a separation layer for total or partial separation of said coating from said prestructured substrate by mechanical, thermomechanical, or vibratory external action; and
exerting said external action on the prestructured substrate and the coating, the external action being exerted by a stress on the prestructured substrate and/or said coating to selectively recover from said nanorelief a top portion and/or a recessed portion of said coating respectively corresponding to said top face and/or said bottom of said prestructured substrate by separating the top portion and/or said recessed portion from the remainder of said coating deposited on said prestructured substrate so that said top portion and/or said recessed portion recovered in this way constitute(s) some or all of said nanostructure.

2. The method according to claim 1, wherein said coating deposited on the top face of said nanorelief is grown substantially in the direction of the thickness of said coating, measured from said top face.

3. The method according to claim 1, wherein said prestructured substrate is covered with said separation layer and then said coating is deposited on that separation layer.

4. The method according to claim 3, wherein said separation layer is added to said substrate by adsorption of a non-stick molecular layer thereon.

5. The method according to claim 1, wherein said separation layer is added to said coating to be deposited on said prestructured substrate so that the separation layer forms an internal sublayer of said coating covering said substrate at the time of deposition.

6. The method according to claim 3, wherein said separation layer is adapted to form a non-stick interface with said prestructured substrate.

7. The method according to claim 1, wherein said external action exerted on said prestructured substrate, said coating, or combination thereof is a mechanical action comprising the application to said prestructured substrate of twisting, bending, cleaving stress, or combination thereof.

8. The method according to claim 1, wherein said external action exerted on said prestructured substrate, said coating, or combination thereof, is a thermomechanical action resulting from the difference between the respective coefficients of thermal expansion of said coating and said prestructured substrate.

9. The method according to claim 1, wherein said external action exerted on said prestructured substrate, said coating, or combination thereof, is a vibratory action comprising transmission of ultrasound to the prestructured substrate covered with said coating.

10. The method according to claim 1, wherein there is further locally incorporated, between said prestructured substrate and said coating, a fixing layer that has a bonding interface with said prestructured substrate to maintain a portion of said coating fixed to said prestructured substrate.

11. The method according to claim 1, wherein said nanorelief takes the form of an elongated plateau having flanks that co-operate with the bottom of said prestructured substrate, with said top face, or with a combination thereof to form one or more clearance or undercut angles in the range 60° to 120°.

12. The method according to claim 11, wherein said top face is substantially plane.

13. The method according to claim 11, wherein said top face comprises a secondary nanorelief that has dimensions smaller than those of said nanorelief and has secondary flanks terminated by a top that are less steep than those of said nanorelief.

14. The method according to claim 13, wherein the secondary flanks of said secondary nanorelief are at an angle substantially equal to 45° and define a pre-etched depth greater than the thickness of said deposited coating.

15. The method according to claim 11, wherein said multilayer coating has a section of curved shape relative to a transverse or oblique plane of said nanorelief.

16. The method according to claim 1, wherein said prestructuring utilizes a reactive ion etching technique.

17. The method according to claim 1, wherein said depositing the coating utilizes a cathode sputtering technique.

18. The method according to claim 1, wherein the step of selectively recovering the top portion of said coating by separating it from the top face of said nanorelief involves no chemical or ionic attack.

19. The method according to claim 1, wherein said nanostructure comprises a nanoscopic first portion and a microscopic or macroscopic second portion which can manipulate said nanostructure individually.

20. The method according to claim 1, wherein said nanostructure is selected from the group consisting of nanofilaments, heating nanopoints for near field microscopy, magnetic points with a wall contrast, nanowaveguides, magnetoresistive sensors, metallic interconnections, and bimetallic strips of curvature that is controlled by a magnetic field.

21. The method according to claim 20, wherein said nanostructure is selected from the group consisting of networks of copper or aluminum nanofilaments, waveguides consisting of stacks of metal/insulator/metal composition nanofilaments, magnetoresistive nanofilaments, and copper or aluminum interconnection lines intended to be placed inverted on a CMOS stack.

22. The method according to claim 4, wherein said non-stick molecular layer comprises at least one material selected from the group consisting of polytetrafluoro-ethylene, $C_4F_8$, and $CF_2$.

23. The method according to claim 6, wherein said substrate comprises silicon dioxide and said separation layer comprises at least one selected from the group consisting of gold, silver, and platinum.

24. The method according to claim 10, wherein said substrate comprises silicon dioxide and said fixing layer comprises at least one of tantalum or titanium.

* * * * *